United States Patent [19]

Chen et al.

[11] Patent Number: 4,736,119

[45] Date of Patent: Apr. 5, 1988

[54] DYNAMIC CMOS CURRENT SURGE CONTROL

[75] Inventors: Che-Tsung Chen, South Whitehall Township, Lehigh County; Kevin D. Kolwicz, Upper Milford Township, Lehigh County; Chin-Jen Lin, South Whitehall Township, Lehigh County; Won J. Yoon, Lower Macungie Township, Lehigh County, all of Pa.

[73] Assignee: American Telephone and Telegraph Company, AT&T Bell Laboratories, Murray Hill, N.J.

[21] Appl. No.: 11,162

[22] Filed: Feb. 4, 1987

[51] Int. Cl.[4] .......................... G06F 1/04; G06F 9/22
[52] U.S. Cl. ................................. 307/269; 307/480; 307/605; 307/452; 307/279; 377/105; 377/106; 364/707
[58] Field of Search ............... 307/443, 452, 453, 469, 307/269, 585, 279, 290, 594, 605, 480; 377/2, 28, 50, 105, 106; 364/707, 200 MS File, 900 MS File; 328/62, 63

[56] References Cited

U.S. PATENT DOCUMENTS

| | | | |
|---|---|---|---|
| 4,317,180 | 2/1982 | Lies | 307/452 X |
| 4,554,465 | 11/1985 | Koike | 307/269 |
| 4,570,219 | 2/1986 | Shibukawa et al. | 364/707 |
| 4,606,053 | 8/1986 | Schröder | 307/269 X |
| 4,641,044 | 2/1987 | Shiraishi | 307/269 |
| 4,686,386 | 8/1987 | Tadao | 307/269 |
| 4,694,196 | 9/1987 | Hasley et al. | 307/269 |
| 4,694,197 | 9/1987 | Sprague | 307/269 |
| 4,700,084 | 10/1987 | Honaker, Jr. | 307/269 |

Primary Examiner—Stanley D. Miller
Assistant Examiner—David R. Bertelson
Attorney, Agent, or Firm—James H. Fox

[57] ABSTRACT

Integrated circuits having a large number of transmission gate logic stages have been found to draw a large current surge on power-up. This is due to the floating input node of complementary inverters causing current to flow briefly before clock pulses arrive. The present invention provides a DC voltage on the gates of the pass transistors until the system clock pulses arrive, thereby eliminating the floating node. An optional periodic window may be generated to examine the system clock after power-up, to detect a loss of clock condition.

8 Claims, 4 Drawing Sheets

DYNAMIC CMOS CURRENT SURGE CONTROL

BACKGROUND OF THE INVENTION

1. Field of the Invention

The present invention relates to a technique for reducing power supply current surges in dynamic transmission gate logic circuits.

2. Description of the Prior Art

Logic integrated circuits, including complementary metal oxide silicon (CMOS) types, are generally classified as being "static" or "dynamic". The static types usually allow for a logic signal to be applied at any time, and immediately generate the resulting logic output signal. The dynamic types generally employ one or more clocked transistors that provide for generating the logical output in synchronism with the clock. One known type of dynamic logic is "transmission gate logic". Referring to FIG. 4, a typical dynamic register cell comprising two stages is shown. In the first stage, a pair of complementary pass transistors (40, 41) allows a logic signal to propagate from the input node (INPUT DATA) to storage node I1, in response to a "master" clock signal and its complement (MCK, MCKB) that is applied to the transistor gates. The logic signal thus appears at the input of an inverter comprising a serially connected complementary transistor pair (42,43). A second stage comprises pass transistors (44,45) controlled by a "slave" clock and its complement (SCK, SCKB). These pass transistors allow the signal to propagate from the output node of the first inverter (I2) to storage node I3, and hence to inverter (46,47) and the output node (OUTPUT). When the pass transistors 40, 41 are non-conducting, the storage node I1 floats in potential. Similarly, when pass transistors 44, 45 are non-conducting, storage node I3 floats. In one variation of this technique, a single pass transistor (e.g., 40, 44) may be used per stage, with a reduction in the clock signals required (e.g., MCK, SCK).

A plurality of transmission gate cells may be combined by connecting their output nodes to an inverter, allowing for complex logic operations using a plurality of logic input signals. In one current design, over 7000 cells on a single integrated circuit are utilized in this fashion. In another arrangement, the cells are utilized to implement a shift register that delays an input signal a desired amount. One important criterion for logic circuits, especially dynamic types, is their power consumption. It is important that the desired implementation not draw excessive current. In particular, as the number of cells per integrated circuit increase, the tendency is for the power consumption to increase. One problem encountered in field effect technology (e.g., CMOS) is that "floating input nodes" may exist when the clock signal disappears. In that case, the inputs to the inverters may float to a potential that allows DC current flow through the inverters. One solution is to provide a negative feedback circuit that clamps the input to a known state (either high or low); see U.S. Pat. No. 4,570,219. That effectively converts the device from a dynamic to a static type. However, that requires additional circuitry in each stage being protected, which increases the cell size of transmission gate logic circuits.

BACKGROUND OF THE INVENTION

SUMMARY OF THE INVENTION

We have invented a technique for reducing current surges for transmission gate logic circuits on an integrated circuit. Means are included for applying a DC voltage to the gates of the pass transistors when the power supply voltage is applied to the integrated circuit. Multi-phase clock signals are thereafter applied to the gates when a system clock signal is detected. Means for periodically generating "window" periods to examine for subsequent loss-of- clock conditions may also be included.

DETAILED DESCRIPTION

The following detailed description refers to a technique for reducing current surges in integrated circuits (ICs) having clocked transmission gate logic. In the present technique, a control circuit provides for applying a DC voltage to the gates of the pass transistors in the transmission gate logic circuitry when the system clock is not detected within a sampling period, referred to as a "window" herein. The supplied DC gate voltage is of a magnitude and polarity such as to cause the pass transistors to conduct, thereby preventing the input nodes of the inverters from "floating" in potential.

Figure 1:
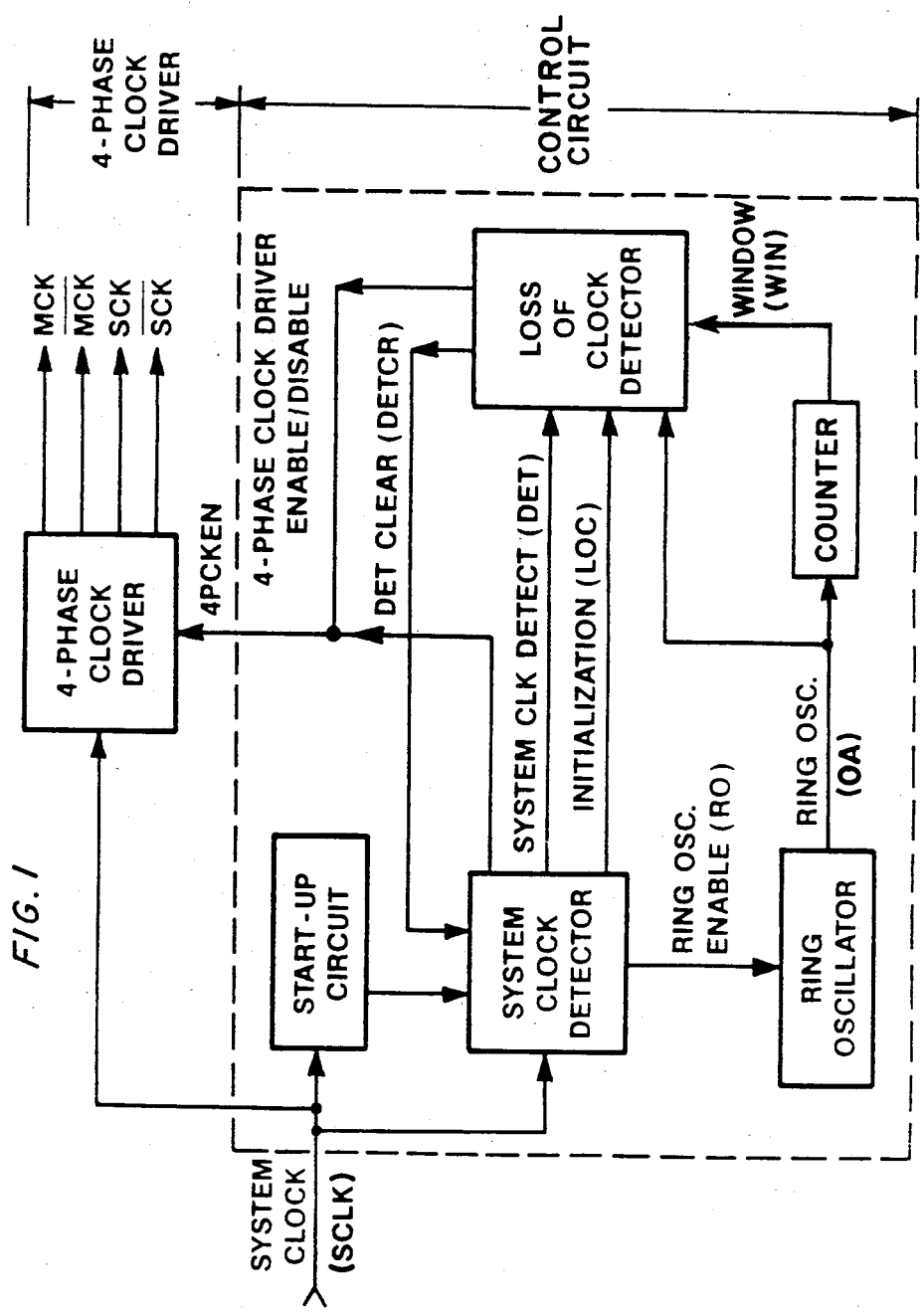
FIG. 1 illustrates a block diagram of one embodiment of the present invention.

Referring to FIG. 1, in a typical embodiment, a control circuit controls a 4-phase clock driver, which generates master signal MCK and its complement MCKB, and also slave signal SCK and its complement SCKB. These signals are supplied to the gates of the pass transistors in the dynamic logic circuitry. The control circuit is supplied with a system clock signal (SCLK) from a system clock. The control circuit of the present invention is typically included on the same IC as the logic circuitry that it controls; the system clock is typically supplied from a source external to the IC, but may alternately also be on the same IC as the logic circuitry.

A summary of the operation of the control circuit, with typical operating parameters, is as follows: During the system power-up, the output of the control circuit disables the 4-phase clock driver. Consequently, the 4-phase clock driver provides logic high to MCK and SCK, and logic low to MCKB and SCKB until the control circuit detects the third system clock. These levels ensure that the pass transistors in the logic circuitry are conducting, so that the input nodes of the associated inverters are not floating, but rather set at either a logic high or logic low level, assuming a logic high or low is present at the INPUT DATA node. As soon as the third system clock is detected, the control circuit enables the 4-phase clock driver to generate non-overlapping 4-phase clocks to the dynamic cells for normal operation. The third system clock was chosen for this purpose to prevent false operation due to noise or spurious signals, with other numbers being alternately possible. While the 4-phase clock driver is generating the 4-phase clocks to the dynamic cells in normal operation, the control circuit checks the system clock approximately every 10 microseconds. If it does not detect any system clock transitions within that 10 microsecond "window", the control circuit immediately disables the 4-phase clock driver to supply logic high to MCK and SCK, and logic low to MCKB and SCKB. Then the control circuit remains at the same state until it detects another system clock transition, at which time it resumes supplying clock signals SCK, SCKB, MCK and MCKB to the logic circuitry.

Referring to FIG. 1, in a typical embodiment the system clock signal SCLK is applied to the start-up circuit. The start-up circuit sends an initialization signal (LOC) to the system clock detector, thereby setting the flip-flops therein to the proper state, each time power is applied to the integrated circuit. The system clock detector also comprises a counter that counts the number of clock signals arriving after the power is initially applied, and supplies a signal RO to the ring oscillator, a signal DET to the loss-of-clock detector, and a signal 4PCKEN to the 4-phase clock driver after a certain number of clock signals have been counted. In a typical case, 3 clock pulses are counted before the RO, DET, and 4PCKEN signals are supplied. The RO signal enables the ring oscillator, which supplies signal OA to the loss-of-clock detector. The ring oscillator also supplies signal OA to a counter that generates a window signal WIN. For example, in a typical case the ring oscillator operates at 200 kHz, and the counter is a divide-by-four counter, thereby generating a WIN signal that is a symmetrical square wave having pulses 10 microseconds in duration. The duration of the window pulses should be greater than the period of the system clock, in order to examine the system clock transitions. The 4-PCKEN signal going high enables the 4-phase clock driver, so that it supplies the clock signals MCK, MCKB, SCK, and SCKB to the logic circuitry.

The loss-of-clock detector starts to operate as soon as the third system clock is detected following the application of power to the control circuit. The loss-of-clock detector is implemented with a finite state machine which checks the system clock transition approximately every 10 microseconds (i.e., the duration of the WIN signal). If the system clock transition does not occur during this window period, the output of this circuit (4PCKEN) will disable the 4-phase clock driver in order to supply logic high to MCK and SCK, and logic low to MCKB and SCKB. Therefore, the internal nodes of the dynamic cells are not allowed to be floating even though the system clock is lost. The loss-of-clock detector also generates a clear signal (DETCR) approximately every 10 microseconds to reset the system clock detector during normal operation. After the reset, the system clock detector will check the system clock transition again while the WIN signal is logic high. If the loss-of-clock detector detects the system clock transition, then this circuit will generate the DETCR signal again. This operation keeps repeating during normal operation.

Figure 2:
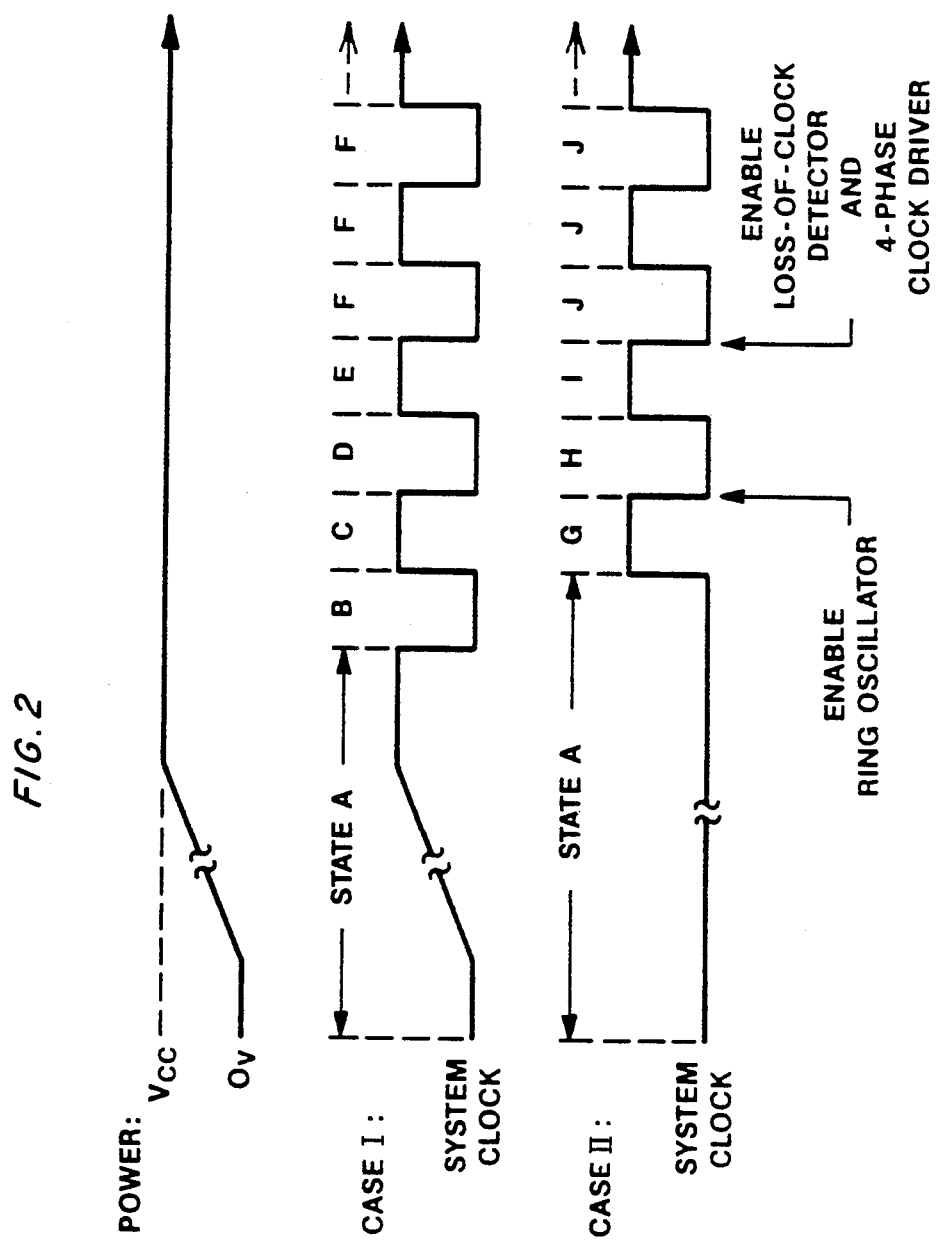
FIG. 2 illustrates the system clock signal when power is applied to the integrated circuit. The system clock begins after a delay with either a logic high (case I), or with a logic low (case II).

An example of the operation of the present technique is illustrated in FIG. 2. During power-up, the power supply voltage increases from 0 volts to Vcc, as indicated, and the system clock does not begin oscillating immediately. Therefore, the system clock signal is not received until after an initial delay. Upon arrival, the system clock signal may begin in a high voltage state (case I), or in a low voltage state (case II). The initial state is referred to as "A" in both cases. The subsequent states "B ... F" and "G ... J" are reached by transitions of the system clock signal (SCLK), in accordance with the state diagram shown in FIG. 3.

Figure 3:
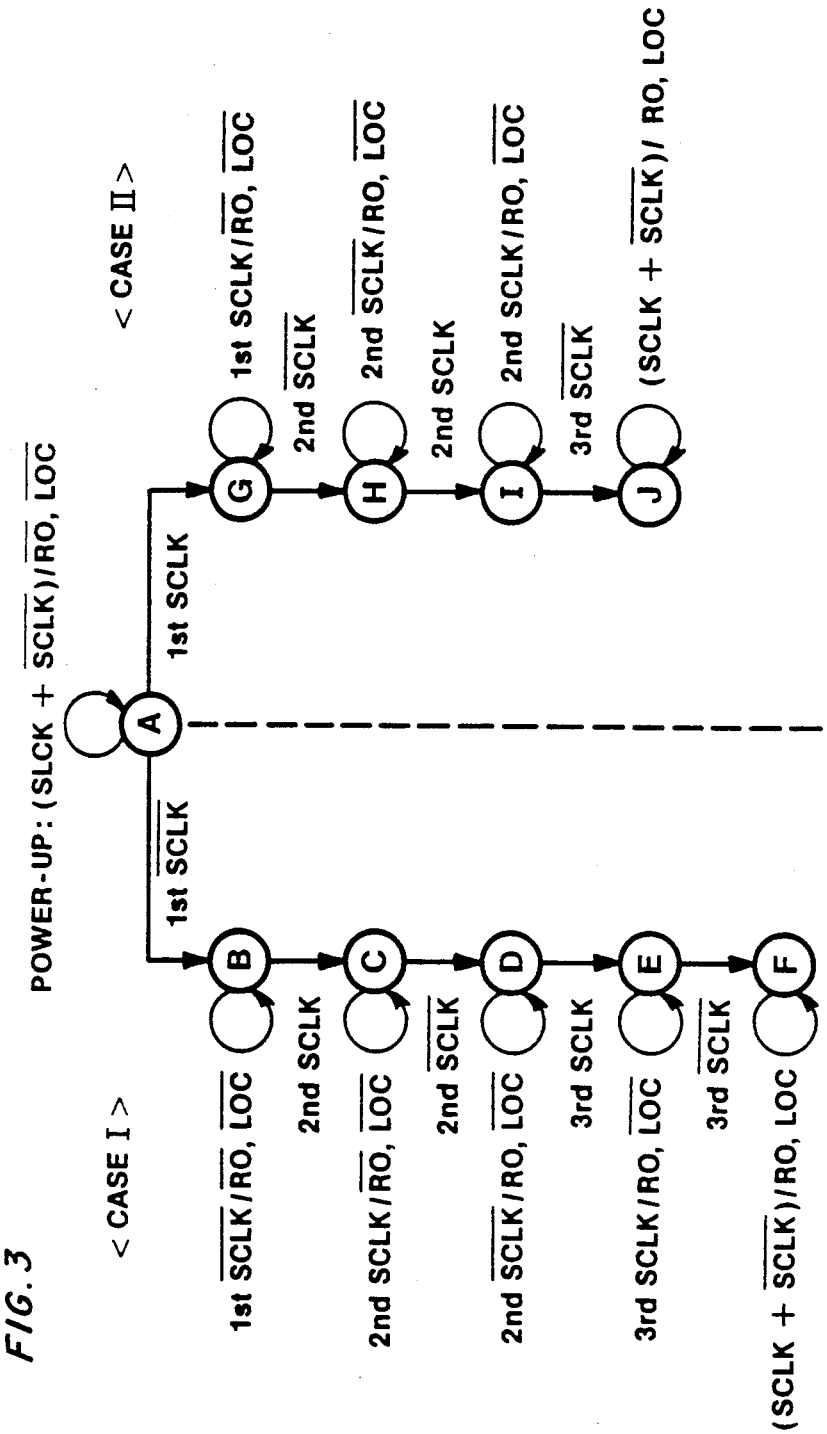
FIG. 3 illustrates the states of the various control signals for the two cases illustrated in FIG. 2.
Figure 4:
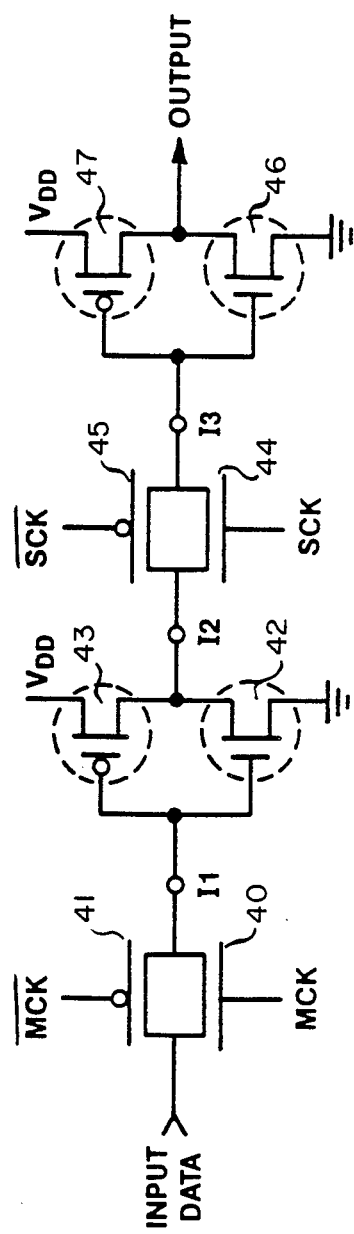
FIG. 4 illustrates a typical prior art transmission gate logic cell.

Referring to FIG. 3, each state (A ... J) is shown with the associated clock transition that produces the state, and the resulting control signal levels, according to the format "clock/control signal". For example, in case I, at power-up the clock signal is high, and the first high-to-low transition of the clock signal (1st SCLKB) places the control circuit in state B. As indicated, in state B the control signals RO and LOC are low, thereby disabling the ring oscillator and the loss-of-clock detector. This in turn disables the clock driver (i.e., places the DC voltages on the gates of the pass transistors.) The next clock transition, to SCLK high (which is the 2nd time SCLK is high), places the control circuit in state C, which also results in RO and LOC low. The next clock transition, to SCLK low (the 2nd time SCLK is low), results in state D, where RO is high and LOC low. Hence, the ring oscillator is enabled, and the loss-of-clock detector remains disabled. The next clock transition (the 3rd time SCLK is high) reaches state E, which results in the same control signal levels as the previous state. Finally, the next clock transition (3rd time SCLK is low) reaches state F, which places both RO and LOC high, allowing the ring oscillator to remain enabled, and enabling the loss-of-clock detector. This in turn enables the clock driver, so that the 4-phase clock signals are applied to the gates of the pass transistors in the transmission gate logic circuitry. As long the the power supply voltage is supplied to the chip, and as long as system clock signals continue to arrive, all subsequent clock transitions maintain state F. Similarly, in case II, the states G ... J are reached as indicated, with the resulting control signal levels for each state as shown. (Note that when the power supply voltage is turned off, and then re-applied to the integrated circuit, the power-up sequences of FIGS. 2 and 3 again apply.)

A CMOS integrated circuity employing over 7000 transmission gate logic cells was redesigned so as to employ the inventive technique. The initial current surge on power-up was reduced from 600 milliamps for the original design to about 20 milliamps for the redesigned circuit. It is anticipated that at higher levels of integration, even larger reductions may be possible with the present technique.

Note that the foregoing has been given in terms of specific window intervals and clock counters, with others being possible. In addition, the clock driver controlled by the control circuit need not be a 4-phase clock driver, but may be another type. For example, the use of 2-phase clocks in transmission gate logic circuitry is also known in the art, wherein only the master and slave (MCK and SCK) signals are generated. The pass transistors are then of a single conductivity type (e.g., n type). Furthermore, it is possible to implement the present technique so as to apply the DC voltage to the gates of the pass transistors only during an initial power-up period, without thereafter periodically generating the "window" for determining loss-of-clock conditions at a later time. That may be appropriate, for example, when the system clock is on the same IC as the logic circuitry, and hence there is low probability that it will be lost in operation. Furthermore, while the above description has shown a digital implementation of the present technique, the control circuitry may alternately be implemented wholly or in part with analog circuitry.

What is claimed is:

1. An integrated circuit comprising transmission gate logic circuitry, means for receiving a system clock signal from a system clock, and means for providing multi-phase clock signals to the gates of pass transistors connected to complementary inverters in said logic circuitry, characterized in that said integrated circuit further comprises control circuitry that causes DC voltages to be applied to said gates so as to cause said pass transistors to conduct when the power supply voltage is applied to said integrated circuit, and to thereafter cause said multi-phase clock signals to be applied to said gates when said system clock signal is detected.

2. The integrated circuit of claim 1 wherein said control circuitry further comprises means to periodically examine said system clock during window periods after said power supply voltage is applied, and to cause DC voltages to be applied to said gates so as to cause said pass transistors to conduct if said system clock signal is not detected during a window period, and to cause said multi-phase clock signals to be applied to said gates if said system clock signal is detected during a window period.

3. The integrated circuit of claim 2 wherein said control circuitry comprises a ring oscillator for generating a window signal having a period longer than the period of said system clock signal, and a loss-of-clock detector for determining whether said system clock signal is present during the window.

4. The integrated circuit of claim 1 wherein said control circuitry comprises means for counting a multiplicity of system clock transitions in order to detect said system clock signal.

5. The integrated circuit of claim 1 wherein the means for providing multi-phase clock signals generates at least non-overlapping master and slave signals.

6. The integrated circuit of claim 1 wherein said integrated circuit is implemented in CMOS technology.

7. The integrated circuit of claim 1 wherein said system clock is located externally to said integrated circuit.

8. The integrated circuit of claim 1 further comprising said system clock.

* * * * *